(12) United States Patent
Wang et al.

(10) Patent No.: US 10,989,842 B2
(45) Date of Patent: Apr. 27, 2021

(54) ANTI-REFLECTIVE FILM, DISPLAY PANEL AND DISPLAY DEVICE HAVING THE SAME, AND FABRICATING METHOD THEREOF

(71) Applicant: BOE TECHNOLOGY GROUP CO., LTD., Beijing (CN)

(72) Inventors: Dongfang Wang, Beijing (CN); Meili Wang, Beijing (CN); Li Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 156 days.

(21) Appl. No.: 15/961,100

(22) Filed: Apr. 24, 2018

(65) Prior Publication Data

US 2018/0239061 A1 Aug. 23, 2018

Related U.S. Application Data

(62) Division of application No. 15/325,863, filed as application No. PCT/CN2016/074215 on Feb. 22, 2016, now Pat. No. 9,983,332.

(30) Foreign Application Priority Data

Jun. 5, 2015 (CN) .......................... 201510303229.7

(51) Int. Cl.
*G02B 1/113* (2015.01)
*G02B 1/118* (2015.01)
(Continued)

(52) U.S. Cl.
CPC .............. *G02B 1/113* (2013.01); *G02B 1/118* (2013.01); *G02B 1/12* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 6,368,470 | B1 | 4/2002 | Woodard |
| 2001/0008710 | A1 | 7/2001 | Takatsuji et al. |

(Continued)

FOREIGN PATENT DOCUMENTS

| | | | |
|---|---|---|---|
| CN | 102304700 A | | 1/2012 |
| CN | 103454702 A | | 12/2013 |

(Continued)

OTHER PUBLICATIONS

International Search Report & Written Opinion dated May 24, 2016 regarding PCT/CN2016/074215.

(Continued)

*Primary Examiner* — Anthony J Frost
(74) *Attorney, Agent, or Firm* — Intellectual Valley Law, P.C.

(57) ABSTRACT

The present application discloses a method of fabricating an anti-reflective film, comprising forming a zinc oxynitride layer on a substrate; annealing the zinc oxynitride layer; and etching the surface of the zinc oxynitride layer with an etching solution to form a micro lenses layer comprising a plurality of micro lenses on surface.

10 Claims, 5 Drawing Sheets

(51) Int. Cl.
*H01L 31/054* (2014.01)
*G02B 1/12* (2006.01)
*G02F 1/1335* (2006.01)
*H01L 51/52* (2006.01)

(52) U.S. Cl.
CPC .. *G02F 1/133502* (2013.01); *G02F 1/133526* (2013.01); *H01L 31/0543* (2014.12); *H01L 51/5275* (2013.01); *H01L 51/5281* (2013.01); *C09K 2323/00* (2020.08); *C09K 2323/051* (2020.08); *G02F 2201/38* (2013.01); *Y02E 10/52* (2013.01)

(56) References Cited

U.S. PATENT DOCUMENTS

| | | | |
|---|---|---|---|
| 2001/0013912 A1* | 8/2001 | Yamazaki | G02F 1/133553 349/113 |
| 2003/0090195 A1 | 5/2003 | Teng | |
| 2005/0007670 A1 | 1/2005 | Jiang et al. | |
| 2006/0148122 A1 | 7/2006 | Han | |
| 2007/0035849 A1 | 2/2007 | Li et al. | |
| 2008/0186572 A1 | 8/2008 | Tomikawa et al. | |
| 2010/0002414 A1* | 1/2010 | Meir | G02B 6/0021 362/84 |
| 2011/0163340 A1* | 7/2011 | Smith | H01L 51/5262 257/98 |
| 2013/0038804 A1* | 2/2013 | Li | G02B 5/1814 349/33 |
| 2013/0235434 A1* | 9/2013 | Akiyama | G02B 3/0068 358/474 |
| 2014/0272390 A1* | 9/2014 | Ding | C03C 17/366 428/336 |

FOREIGN PATENT DOCUMENTS

| | | |
|---|---|---|
| CN | 203496357 U | 3/2014 |
| CN | 103921487 A | 7/2014 |
| JP | 2000067657 A | 3/2000 |
| KR | 20130127658 A | 11/2013 |
| WO | 2001048261 A1 | 7/2001 |
| WO | 2013106166 A1 | 7/2013 |

OTHER PUBLICATIONS

First Office Action in the Chinese Patent Application No. 201510303229.7, dated Feb. 3, 2016; English translation attached.
Requirement for Restriction/Election in the U.S. Appl. No. 15/325,863, dated Aug. 9, 2017.
Optical and Electrical Properties of Nitrogen Doped ZnO Thin Films Prepared by Low Cost Spray Pyrolysis Technique, S. Sriram et al., Journal of Electron Devices, vol. 15, 2012, pp. 1215-1224.
Response to Requirement for Restriction/Election in the U.S. Appl. No. 15/325,863, dated Aug. 18, 2017.
Non-Final Rejection in the U.S. Appl. No. 15/325,863, dated Sep. 7, 2017.
Response to Non-Final Rejection in the U.S. Appl. No. 15/325,863, dated Oct. 20, 2017.
Final Rejection in the U.S. Appl. No. 15/325,863, dated Nov. 29, 2017.
Response After Final Action in the U.S. Appl. No. 15/325,863, dated Jan. 24, 2018.
Advisory Action in the U.S. Appl. No. 15/325,863, dated Feb. 27, 2018.
Request for Continued Examination in the U.S. Appl. No. 15/325,863, dated Mar. 26, 2018.
Notice of Allowance in the U.S. Appl. No. 15/325,863, dated Mar. 26, 2018.

* cited by examiner

| Forming a zinc oxynitride layer on a substrate. |
|---|
| Annealing the zinc oxynitride layer. |
| Etching the surface of the zinc oxynitride layer with an etching solution to form a micro lenses layer having a plurality of micro lenses on surface. |

Without AR treatment　　　　With AR treatment

ANTI-REFLECTIVE FILM, DISPLAY PANEL AND DISPLAY DEVICE HAVING THE SAME, AND FABRICATING METHOD THEREOF

CROSS-REFERENCE TO RELATED APPLICATION

This application is a divisional of U.S. application Ser. No. 15/325,863, filed Feb. 22, 2016, which is a national stage application under 35 U.S.C. § 371 of International Application No. PCT/CN2016/074215 filed Feb. 22, 2016, which claims priority to Chinese Patent Application No. 201510303229.7, filed Jun. 5, 2015. Each of the forgoing applications is herein incorporated by reference in its entirety for all purposes.

FIELD

The present invention relates to display technology, more particularly, to an anti-reflective film, a display panel and a display device having the same, and a fabricating method thereof.

BACKGROUND

In recent years, technology advances have been made in many types of display devices, including light emitting diodes (LED), organic light emitting diodes (OLED), Plasma display panels (PDP) and liquid crystal display panels (LCD).

FIG. 1 is a diagram illustrating the structure of a liquid crystal display panel. Referring to FIG. 1, the liquid crystal display panel includes a first substrate 101 and a second substrate 102 opposite to the first substrate 101, and a liquid crystal layer 103 between the first substrate 101 and the second substrate 102. Metal lines 104 (e.g., data lines or gate lines) are on the second substrate 102. A surface of the first substrate distal to the second substrate is the light emitting surface of the liquid crystal display panel. When ambient light shines on the display panel, a portion of ambient light is reflected by the first substrate 101, and a portion of ambient light transmits into the display panel through the first substrate 101. Inside the display panel, some transmitted ambient light is reflected by the surface of metal lines 104. The reflected light then exits the display panel through the first substrate 101, lowering the contrast of the display image.

SUMMARY

In one aspect, the present invention provides a method of fabricating an anti-reflective film, comprising forming a zinc oxynitride layer on a substrate; annealing the zinc oxynitride layer; and etching the surface of the zinc oxynitride layer with an etching solution to form a micro lenses layer comprising a plurality of micro lenses on surface.

Optionally, each of the plurality of micro lenses comprises a zinc oxynitride grain.

Optionally, each of the plurality of micro lenses has a diameter in the range of about 20 nm to about 500 nm.

Optionally, the micro lenses layer has a refraction index larger than that of the substrate.

Optionally, the grain has a substantially sphere or hemisphere shape.

Optionally, the etching solution comprises an etchant in a concentration of about 0.001 M to about 0.05 M with an etching duration in the range of about 20 seconds to about 120 minutes.

Optionally, the etchant is an acid.

Optionally, the annealing is performed at a temperature in the range of about 300° C. to about 500° C.

Optionally, the annealing is performed in vacuum or in an atmosphere comprising nitrogen or air.

Optionally, the annealing is performed with an annealing duration in the range of about 10 minutes to about 60 minutes.

Optionally, the method further comprises forming a transparent insulating layer on a side of the micro lenses layer distal to the substrate, wherein the transparent insulating layer has a refractive index larger than that of the micro lenses layer.

Optionally, the transparent insulating layer is made of a material comprising silicon nitride.

In another aspect, the present invention provides an anti-reflective film, comprising a micro lenses layer comprising a plurality of micro lenses, each of the plurality of micro lenses comprises a zinc oxynitride grain.

Optionally, each of the plurality of micro lenses has a diameter in the range of about 20 nm to about 500 nm.

Optionally, the grain has a substantially sphere or hemisphere shape.

Optionally, the anti-reflective film further comprises a transparent insulating layer over the plurality of micro lenses, the transparent insulating layer has a refractive index larger than that of the micro lenses layer.

Optionally, the transparent insulating layer is made of a material comprising silicon nitride.

In another aspect, the present invention further provides a display panel comprising a first substrate and a second substrate opposite to the first substrate, a surface of the first substrate distal to the second substrate is a light emitting surface of the display panel; and an anti-reflective film on a side of the first substrate proximal to the second substrate.

Optionally, the anti-reflective film comprises a micro lenses layer comprising a plurality of micro lenses, each of the plurality of micro lenses comprises a zinc oxynitride grain.

Optionally, each of the plurality of micro lenses has a diameter in the range of about 20 nm to about 500 nm.

Optionally, the grain has a sphere or hemisphere shape.

Optionally, the anti-reflective film further comprises a transparent insulating layer on a side of the micro lenses layer distal to the first substrate, the transparent insulating layer has a refractive index larger than that of the micro lenses layer.

Optionally, the transparent insulating layer is made of a material comprising silicon nitride.

Optionally, the display panel is a liquid crystal display panel, and the second substrate is an array substrate.

Optionally, the display panel is a top-emitting organic light emitting display panel, and the second substrate is an array substrate.

Optionally, the display panel is a bottom-emitting organic light emitting display panel, and the first substrate is an array substrate.

In another aspect, the present invention provides a display device comprising a display panel as described herein.

In another aspect, the present invention provides a display device comprising an anti-reflective film as described herein or manufactured by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Reflection of ambient light lowers the contrast of display image. In conventional display devices, an anti-reflective film sealed on a light emitting surface of the display panel is used to improve the contrast. The sealing process is complex and prone to produce electrostatic charges, which may damage electrodes in the display panel. Further, conventional anti-reflective films typically add on additional thickness to the display panel, and are costly to make. Having an additional film thus increases the overall thickness of the display panel and the manufacturing costs.

In one aspect, the present disclosure provides an anti-reflective film with superior anti-reflective properties. The present anti-reflective film is easy to fabricate and does not require a complex sealing process. Having the present anti-reflective film in a display panel does not increase the overall thickness of the display panel or the manufacturing costs.

Figures 1, 2:
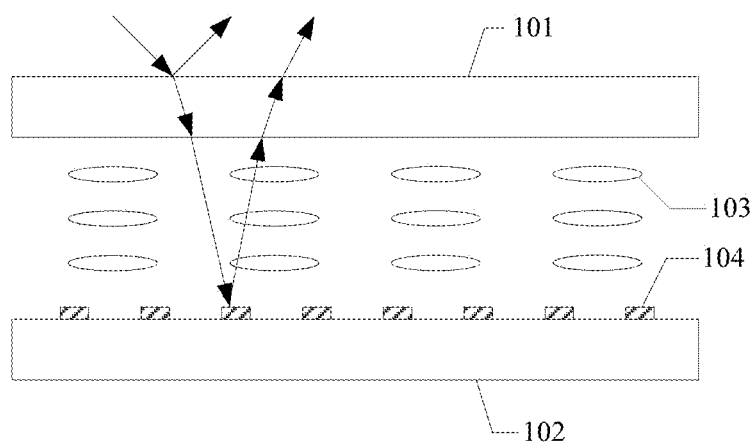
FIG. 1 is a diagram illustrating ambient light path in a conventional liquid crystal display panel.
FIG. 2 is a flow chart illustrating the structure of a method of fabricating an anti-reflective film in some embodiments.

FIG. 2 is a flow chart illustrating the structure of a method of fabricating an anti-reflective film in some embodiments. Referring to FIG. 2, the method in the embodiment includes forming a zinc oxynitride layer on a substrate, annealing the zinc oxynitride layer, and etching the surface of the zinc oxynitride layer with an etching solution to form a micro lenses layer having a plurality of micro lenses on surface. Optionally, each of the plurality of micro lenses includes a zinc oxynitride grain.

As used herein the term "micro lens" refers to a small lens, for instance, with a diameter less than a few millimeter, e.g., in the range of about 1 nm to about 10 μm, about 1 nm to about 5 μm, about 1 nm to about 2 μm, about 1 nm to about 1 μm, about 1 nm to about 0.5 μm, about 5 nm to about 5 μm, about 5 nm to about 2 μm, about 5 nm to about 1 μm, about 5 nm to about 0.5 μm, about 10 nm to about 2 μm, about 10 nm to about 1 μm, about 10 nm to about 0.5 μm, about 20 nm to about 500 nm, about 50 nm to about 300 nm, or about 100 nm to about 200 nm. Optionally, the micro lens is a grain (e.g., a zinc oxynitride grain). Optionally, the micro lens is a grain (e.g., a zinc oxynitride grain) having a substantially sphere or hemisphere shape (or quarter sphere, a portion of a sphere, or any appropriate shape). Optionally, the micro lens has a convex shape for transmitting light. Optionally, the micro lenses may be arranged in form of an array (e.g., a non-uniform array in which lenses may not be equidistantly spaced and/or equal in size). Optionally, the micro lenses may be arranged in a two-dimensional array (e.g., a non-uniform two-dimensional array). Optionally, the micro lenses are arranged on a surface of a substrate. Optionally, the micro lenses layer has a refraction index larger than that of the substrate.

The grains may have any appropriate shapes. Optionally, the grains (i.e., the micro lenses) have a substantially sphere or hemisphere shape. Optionally, the grains have a substantially pyramid shape, a substantially cone shape, a substantially cylinder shape, a substantially cube shape, a substantially triangular prism shape, or a substantially rectangular prism shape.

The anti-reflective film formed by the present method has several advantages. The fabrication process does not involve a complex sealing process. Many defects associated with the sealing process can be avoided. The shape and sizes of the zinc oxynitride grains can be easily controlled by the present fabrication process. Consequently, the anti-reflective film fabricated according to the present method does not result in an increased overall thickness of the display panel or an increased manufacturing costs.

The zinc oxynitride layer may be formed by any appropriate method. For instance, zinc metal oxynitride layer may be formed by deposition methods. Examples of deposition methods include, but are not limited to, sputtering (e.g., magnetron sputtering) and evaporation coating (e.g., a Chemical Vapor Deposition method, a Plasma-Enhanced Chemical Vapor Deposition (PECVD) method, a thermal vapor deposition method). The substrate on which the zinc oxynitride layer is formed may be a base substrate, or a base substrate having other layers or components prior to the formation of the zinc oxynitride layer.

In some embodiments, the zinc oxynitride layer is formed by magnetron sputtering. In a magnetron sputtering process, magnetron sputtering apparatus induces plasma ions of a gas to bombard a target, causing surface atoms of the target material to be ejected and deposited as a film or layer on the surface, of a substrate. For example, zinc or zinc oxide may be used as the sputtering target, and a plasma including argon is used to bombard the sputtering target. The plasma may further includes oxygen and nitrogen gases, adding oxygen and nitrogen into zinc or zinc oxide, thereby forming a zinc oxynitride layer when the target is deposited on the substrate. The ratio among the zinc, oxygen, and nitrogen may be controlled by adjusting the contents of oxygen and nitrogen in the plasma. Accordingly, the properties of the zinc oxynitride layer can be controlled.

Various embodiments of annealing conditions may be practiced. In some embodiments, the annealing is performed in an oxygen-free atmosphere, e.g., in vacuum or nitrogen. In some embodiments, the annealing may be performed in air. The contents of the annealing atmosphere may be selected such that the zinc oxynitride layer is not oxidized into zinc oxide under the selected atmosphere. In some embodiments, the annealing is performed at a temperature in the range of about 300° C. to about 500° C., e.g., 300° C. to about 350° C., 350° C. to about 400° C., 400° C. to about 450° C., or 450° C. to about 500° C. In some embodiments, the annealing is performed with an annealing duration in the range of about 10 minutes to about 60 minutes, e.g., about 10 minutes to about 20 minutes, about 20 minutes to about 30 minutes, about 30 minutes to about 40 minutes, about 40 minutes to about 40 minutes, or about 50 minutes to about 60 minutes. Various alternative annealing temperatures, durations, and/or atmosphere may be practiced. By selecting different annealing conditions, the shapes and/or sizes of zinc oxynitride crystals may be obtained. Optionally, zinc oxynitride crystals having a diameter in a range of about 100 nm to about 200 nm may be obtained at an annealing temperature of about 300° C. with an annealing duration of about 60 minutes.

Any appropriate etching solution may be used to form the micro lens layer. In some embodiments, the etchant is an acid (e.g., hydrochloride, sulfuric acid, or nitric acid) or a mixture of two or more acids. In some embodiments, the etchant is a lye (e.g., potassium hydroxide, sodium hydroxide, or ammonia), or a mixture of two or more lyes. Optionally, the etching solution includes an etchant in a concentration of about 0.001 M to about 0.05 M. Optionally, the etching is performed with an etching duration in the range of about 20 seconds to about 120 minutes, e.g., about 20 seconds to about 1 minutes, about 1 minutes to about 10 minutes, about 10 minutes to about 30 minutes, about 30 minutes to about 60 minutes, about 60 minutes to about 90 minutes, about 90 minutes to about 120 minutes. The etching rate of crystalline zinc oxynitride is much slower than that of the amorphous zinc oxynitride. Thus, by etching the annealed zinc oxynitride layer with an etching solution (e.g., an acid or a base), the amorphous zinc oxynitride can be removed, leaving the crystalline zinc oxynitride grains on the surface of the layer, thereby forming the micro lenses structure. Optionally, the crystalline grains have a substantially sphere or hemisphere shape.

Figure 3A:
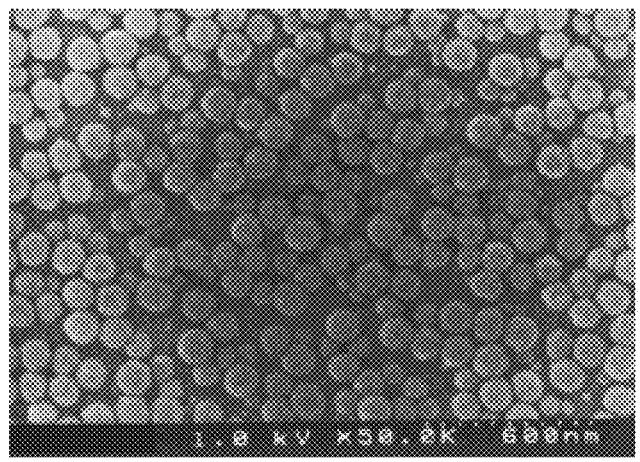
FIG. 3A is a scanning electron microscope image of an anti-reflective film in some embodiments in plan view.
Figure 3B:
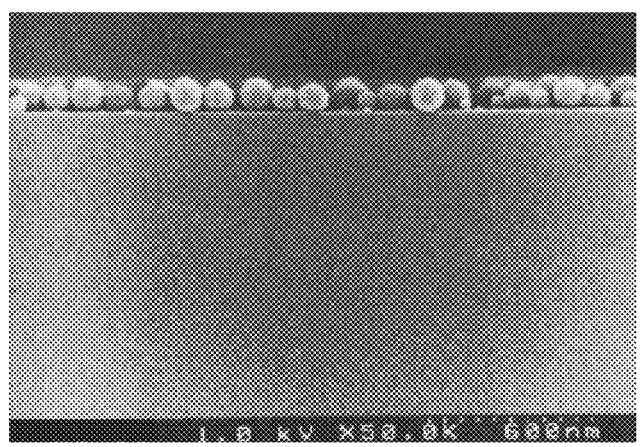
FIG. 3B is a scanning electron microscope image of an anti-reflective film in some embodiments in side view.

FIG. 3A is a scanning electron microscope image of an anti-reflective film in some embodiments in plan view. FIG. 3B is a scanning electron microscope image of an anti-reflective film in some embodiments in side view. The micro lenses layer is formed at an annealing temperature of about 300° C. with an annealing duration of about 60 minutes. Referring to FIGS. 3A and 3B, the accelerating voltage of the electrons used in the scanning electron microscope is 1000 V, the magnification of the scanning electron microscope is 50,000. In FIGS. 3A and 3B, 10 bars equal to 600 nm. Thus, the zinc oxynitride grains in FIGS. 3A and 3B have an average size of about 100 nm.

In some embodiments, the method further includes forming a transparent insulating layer on a side of the micro lenses layer distal to the substrate. Optionally, the transparent insulating layer has a refractive index larger than that of the micro lenses layer. By having a transparent insulating layer having a refractive index larger than that of the micro lenses layer, the anti-reflective properties of the anti-reflective film can be further improved, and the contrast of display image further enhanced.

Any appropriate transparent material may be used for making the transparent insulating layer. The selection of the transparent insulating layer depends on various factors. For example, one consideration in choosing a material for making the transparent insulating layer is its refractive index relative to that of the micro lenses layer. Optionally, the transparent insulating layer is made of a material including silicon nitride. The refractive index of silicon nitride is about 2.05, and the refractive index of the zinc oxynitride micro lenses layer is about 1.9 to about 2. Optionally, other materials having a refractive index larger than 2 may be used.

In another aspect, the present disclosure provides an anti-reflective film including a micro lenses layer. The micro lenses layer includes a plurality of micro lenses, each of which includes a zinc oxynitride grain.

Optionally, the micro lens has a diameter in the range of about 1 nm to about 10 µm, about 1 nm to about 5 µm, about 1 nm to about 2 µm, about 1 nm to about 1 µm, about 1 nm to about 0.5 µm, about 5 nm to about 5 µm, about 5 nm to about 2 µm, about 5 nm to about 1 µm, about 5 nm to about 0.5 µm, about 10 nm to about 2 µm, about 10 nm to about 1 µm, about 10 nm to about 0.5 µm, about 20 nm to about 500 nm, about 50 nm to about 300 nm, or about 100 nm to about 200 nm. Optionally, the micro lens is a grain (e.g., a zinc oxynitride grain). Optionally, the micro lens is a grain (e.g., a zinc oxynitride grain) having a substantially sphere or hemisphere shape (or quarter sphere, a portion of a sphere, or any appropriate shape). Optionally, the micro lens has a convex shape for transmitting light. Optionally, the micro lenses may be arranged in form of an array (e.g., a non-uniform array in which lenses may not be equidistantly spaced and/or equal in size). Optionally, the micro lenses may be arranged in a two-dimensional array (e.g., a non-uniform two-dimensional array). Optionally, the micro lenses are arranged on a surface of a substrate. Optionally, the micro lenses layer has a refraction index larger than that of the substrate.

The present anti-reflective film has several advantages. The fabrication of the present anti-reflective film does not require a complex sealing process. Many defects associated with the sealing process can be avoided. Further, the shape and sizes of the zinc oxynitride grains can be easily controlled. Consequently, the present anti-reflective film does not result in an increased the overall thickness of the display panel or an increased manufacturing costs.

Optionally, each of the plurality of micro lenses has a diameter in the range of about 20 nm to about 500 nm.

Figure 5:
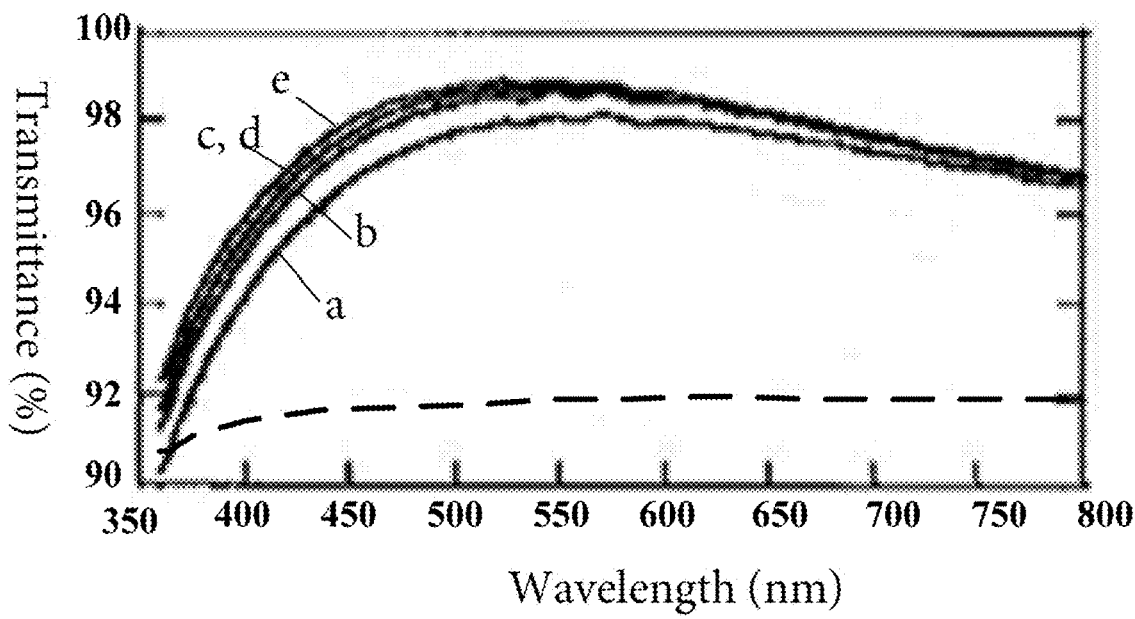
FIG. 5 shows a light transmittance curve of an anti-reflective film and a glass substrate in some embodiments.
Figure 6:
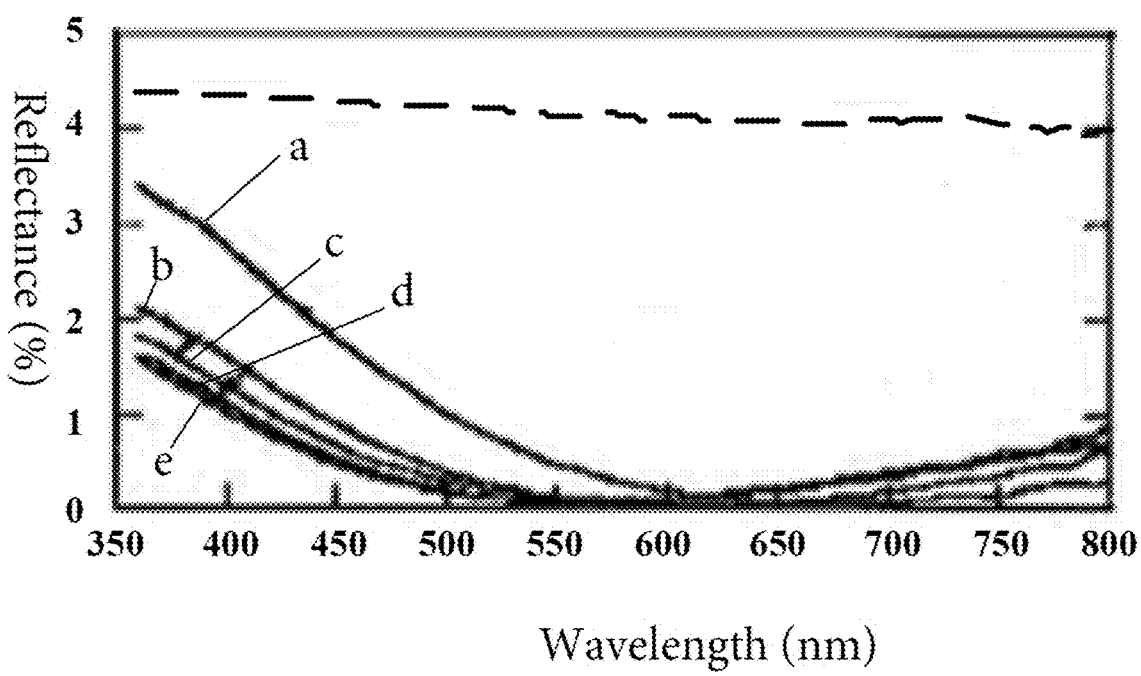
FIG. 6 shows a light reflectance curve of an anti-reflective film and a glass substrate in some embodiments.
Figure 9:
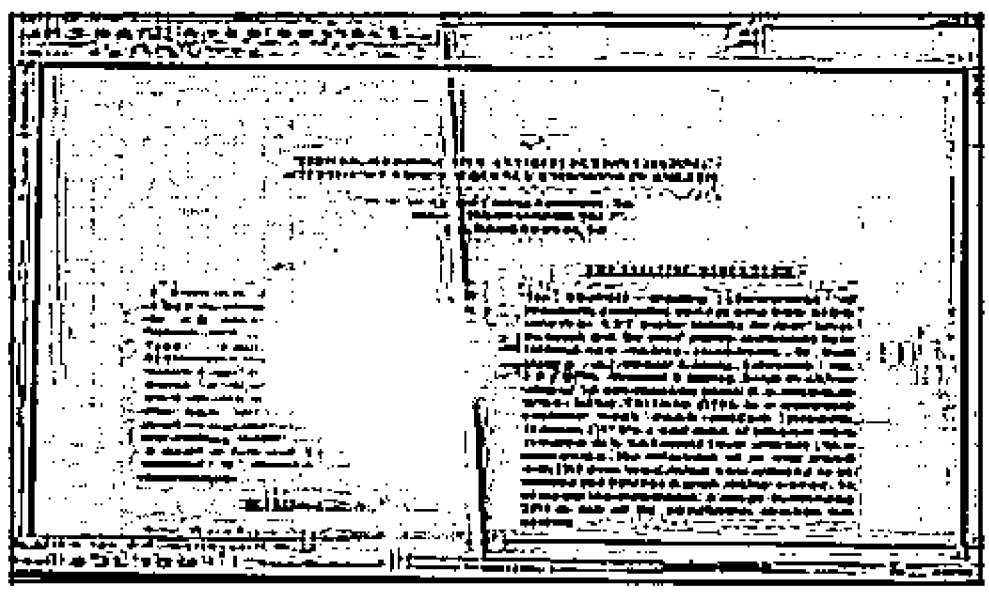
FIG. 9 shows significantly improved contrast of display image in a display panel having the anti-reflective film in some embodiments (right) as compared to a conventional display panel (left).

FIG. 5 shows a light transmittance curve of an anti-reflective film and a glass substrate in some embodiments. FIG. 6 shows a light reflectance curve of an anti-reflective film and a glass substrate in some embodiments. Referring to FIG. 5, the light transmittance of the anti-reflective films having various micro lenses sizes in some embodiments (indicated as a-e) have significantly higher light transmittance than a glass base substrate (indicated as a dashed line). Referring to FIG. 6, the light reflectance of the anti-reflective films having various micro lenses sizes in some embodiments (indicated as a-e) have significantly lower light reflectance than a glass base substrate (indicated as a dashed line). FIG. 9 shows significantly improved contrast of display image in a display panel having the anti-reflective film in some embodiments (right) as compared to a conventional display panel (left).

The grains may have any appropriate shapes. Optionally, the grains (i.e., the micro lenses) have a substantially sphere or hemisphere shape. Optionally, the grains have a substantially pyramid shape, a substantially cone shape, a substantially cylinder shape, a substantially cube shape, a substantially triangular prism shape, or a substantially rectangular prism shape.

Figure 4:
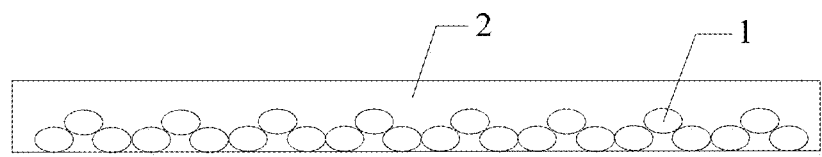
FIG. 4 is a diagram illustrating the structure of an anti-reflective film in some embodiments.

FIG. 4 is a diagram illustrating the structure of an anti-reflective film in some embodiments. Referring to FIG. 4, the anti-reflective film in the embodiment further includes a transparent insulating layer over the plurality of micro lenses. Optionally, the transparent insulating layer has a refractive index larger than that of the micro lenses layer. By having a transparent insulating layer having a refractive index larger than that of the micro lenses layer, the anti-reflective properties of the anti-reflective film can be further improved, and the contrast of display image further enhanced.

Any appropriate transparent material may be used for making the transparent insulating layer. The selection of the transparent insulating layer depends on various factors. For example, one consideration in choosing a material for making the transparent insulating layer is its refractive index relative to that of the micro lenses layer. Optionally, the transparent insulating layer is made of a material including silicon nitride. The refractive index of silicon nitride is about 2.05, and the refractive index of the zinc oxynitride micro lenses layer is about 1.9 to about 2. Optionally, other materials having a refractive index larger than 2 may be used.

Figure 7:
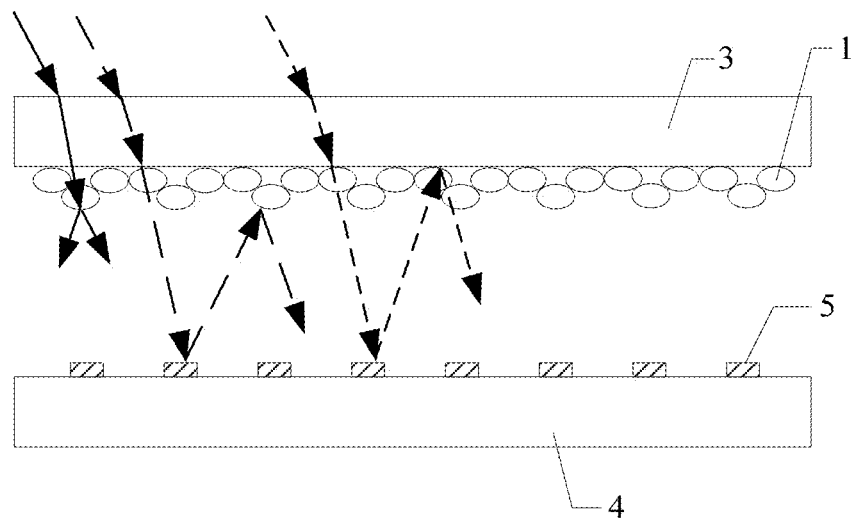
FIG. 7 is a diagram illustrating ambient light path in a display panel in some embodiments.
Figure 8:
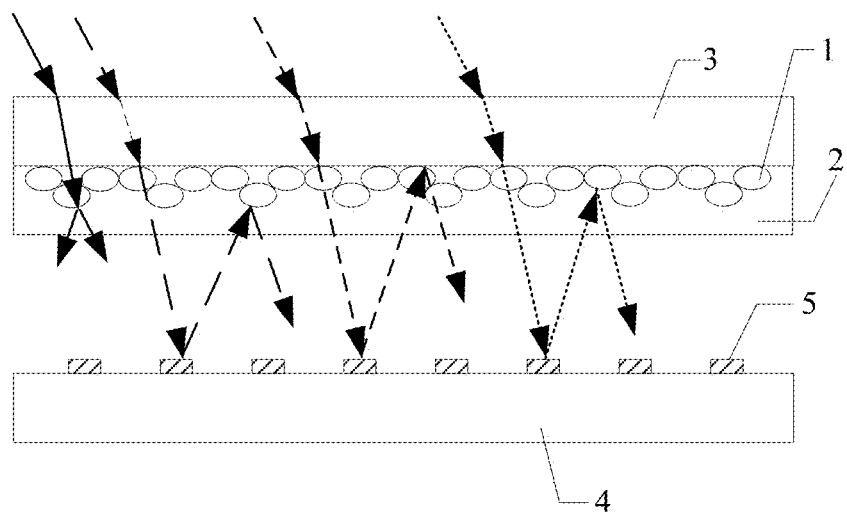
FIG. 8 is a diagram illustrating ambient light path in a display panel in some embodiments.

In another aspect, the present disclosure provides a display panel. FIG. 7 is a diagram illustrating ambient light path in a display panel in some embodiments. FIG. 8 is a diagram illustrating ambient light path in a display panel in some embodiments. Referring to FIGS. 7 and 8, the display panels in the embodiments include a first substrate 3 and a second substrate 4 opposite to the first substrate 3. A surface of the first substrate 3 distal to the second substrate 4 is a light emitting surface of the display panels. The display panels in the embodiments further include an anti-reflective film on a side of the first substrate 3 proximal to the second substrate 4.

Referring to FIG. 7, the anti-reflective film includes a micro lenses layer including a plurality of micro lenses. Each of the plurality of micro lenses comprises a zinc oxynitride grain 1. Referring to FIG. 8, the anti-reflective film includes a micro lenses layer including a plurality of micro lenses, and a transparent insulating layer 2 on a side of the micro lenses layer distal to the first substrate 3. Each of the plurality of micro lenses comprises a zinc oxynitride grain 1. Optionally, the transparent insulating layer 2 has a refractive index larger than that of the micro lenses layer.

As shown in FIG. 7, by having an anti-reflective film on a side of the first substrate 3 proximal to the second substrate 4, the ambient light transmittance can be enhanced (as indicated by the light path in solid lines) and ambient light reflectance much reduced on a side of the first substrate 3 distal to the second substrate 4. The ambient light transmitted into the display panel may be reflected by metal lines 5. Diffuse reflectance occurs when some reflected light encounters the micro lenses (as indicated by the long-dashed lines). Because the micro lenses layer has a refractive index larger than that of the first substrate 3 (e.g., a glass substrate has a refractive index of about 1.5 to about 1.7), some reflected light may be totally reflected at the interface between the micro lenses layer and the first substrate 3 (as indicated by the short-dashed lines). Based on the above, the reflected light (by the metal lines 5) exiting the side of the first substrate 3 distal to the second substrate 4 can be significantly reduced, effectively improving the contrast of the display image.

As shown in FIG. 8, by having an anti-reflective film on a side of the first substrate 3 proximal to the second substrate 4, the ambient light transmittance can be enhanced (as indicated by the light path in solid lines) and ambient light reflectance much reduced on a side of the first substrate 3 distal to the second substrate 4. The ambient light transmitted into the display panel may be reflected by metal lines 5. Diffuse reflectance occurs when some reflected light encounters the micro lenses (as indicated by the long-dashed lines). Because the transparent insulating layer 2 has a refractive index larger than that of the micro lenses layer, some reflected light may be totally reflected at the interface between the micro lenses layer and the first substrate 3 (as indicated by the short-dashed lines). Further, the anti-reflective film has a transparent insulating layer on a side of the micro lenses layer distal to the first substrate, the transparent insulating layer has a refractive index larger than that of the micro lenses layer. Some reflected light may be totally reflected at the interface between the transparent insulating layer 2 and the micro lenses layer (as indicated by the dotted lines). Based on the above, the reflected light (by the metal lines 5) exiting the side of the first substrate 3 distal to the second substrate 4 can be significantly reduced, effectively improving the contrast of the display image.

The display panel may be any appropriate type of display panel. Optionally, the display panel is a liquid crystal display panel. Optionally, the second substrate is an array substrate. Optionally, the first substrate is on a light emitting side of the liquid crystal display panel, the anti-reflective film is on a side of the first substrate proximal to the second substrate. Optionally, the display panel may further include a black matrix, a color filter, an alignment layer on a side of the anti-reflective layer proximal to the second substrate. Optionally, the display panel may further include a gate line, a data line, a gate electrode, a thin film transistor on a side of the second substrate proximal to the first substrate. Optionally, the display panel is a Twisted Nematic liquid crystal display panel having a common electrode on a side of the first substrate proximal to the second substrate. Optionally, the display panel is an Advanced Super Dimension Switch liquid crystal display panel or an In-Plane Switch liquid crystal display panel having a common electrode on a side of the second substrate proximal to the first substrate.

In some embodiments, the display panel is an organic light emitting display panel. Optionally, the display panel is a top-emitting organic light emitting display panel. Optionally, the second substrate is an array substrate having a light emitting layer on a side of the second substrate proximal to the first substrate. Optionally, the first substrate is on a light emitting side of the organic light emitting display panel. The first substrate and the second substrate (array substrate) are assembled together to form the top-emitting organic light emitting display panel.

Optionally, the display panel is a bottom-emitting organic light emitting display panel. Optionally, the first substrate is an array substrate having a light emitting layer on a side of the first substrate proximal to the second substrate. Optionally, the second substrate is on a light emitting side of the organic light emitting display panel. The first substrate (array substrate) and the second substrate are assembled together to form the top-emitting organic light emitting display panel.

In another aspect, the present disclosure provides a display device having a display panel described herein. Examples of appropriate display devices includes, but are not limited to, an electronic paper, a mobile phone, a tablet computer, a television, a monitor, a notebook computer, a digital album, a gps, etc. The display device of the present disclosure has an exceptional light emission efficiency.

The present disclosure provides an anti-reflective film, a display panel and a display device having the same, and a fabricating method thereof. In some embodiments, the method includes forming a zinc oxynitride layer on a substrate, annealing the zinc oxynitride layer, and etching the surface of the zinc oxynitride layer with an etching solution to form a micro lenses layer having a plurality of micro lenses on surface. Optionally, each of the plurality of micro lenses includes a zinc oxynitride grain.

The anti-reflective film formed by the present method has several advantages. The fabrication process does not involve a complex sealing process. Many defects associated with the sealing process can be avoided. The shape and sizes of the zinc oxynitride grains can be easily controlled by the present fabrication process. Consequently, the anti-reflective film fabricated according to the present method does not result in an increased overall thickness of the display panel or an increased manufacturing costs.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting display panel, comprising:
   a counter substrate;
   an array substrate opposite to the counter substrate; and
   an anti-reflective film;
   wherein the array substrate comprises thin film transistors, a light emitting layer, and a plurality of metal lines;
   the anti-reflective film is on a first side of a base substrate of the array substrate facing the counter substrate;
   the base substrate has a second side facing away from the counter substrate, the second side is a light emitting side of the display panel;
   the anti-reflective film comprises a micro lenses layer comprising a plurality of micro lenses, each of the plurality of micro lenses comprises a zinc oxynitride grain; and
   each of the plurality of micro lenses has a diameter in a range of about 1 nm to about 10 μm.

2. The display panel of claim 1, wherein each of the plurality of micro lenses has a diameter in a range of about 20 nm to about 500 nm.

3. The display panel of claim 1, wherein the zinc oxynitride grain has a sphere or hemisphere shape.

4. The display panel of claim 1, wherein the anti-reflective film further comprises a transparent insulating layer on a side of the micro lenses layer away from the base substrate, the transparent insulating layer has a refractive index larger than that of the micro lenses layer.

5. The display panel of claim 4, wherein the transparent insulating layer is made of a material comprising silicon nitride.

6. The display panel of claim 1, wherein each of the plurality of micro lenses has a diameter in a range of about 20 nm to about 5 μm.

7. The display panel of claim 1, wherein the plurality of micro lenses are formed as a non-uniform two-dimensional array.

8. The display panel of claim 1, wherein the plurality of micro lenses are formed to be non-uniformly spaced and have non-uniform size distribution.

9. The display panel of claim 1, wherein the display panel is an organic light emitting display panel.

10. The display panel of claim 1, wherein the anti-reflective film is between the base substrate and the light emitting layer or the plurality of metal lines or the thin film transistors.

* * * * *